United States Patent
Jeddeloh

(10) Patent No.: US 7,895,485 B2
(45) Date of Patent: Feb. 22, 2011

(54) SYSTEM AND METHOD FOR TESTING A PACKETIZED MEMORY DEVICE

(75) Inventor: Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 493 days.

(21) Appl. No.: 12/006,480

(22) Filed: Jan. 2, 2008

(65) Prior Publication Data

US 2009/0172480 A1 Jul. 2, 2009

(51) Int. Cl.
*G01R 31/28* (2006.01)
*G11C 29/00* (2006.01)
*G06F 11/00* (2006.01)

(52) U.S. Cl. .................... 714/724; 714/801; 714/718
(58) Field of Classification Search .............. 714/718, 714/719, 724, 738, 776, 800, 801, 819, 814; 324/754, 755, 765, 537
See application file for complete search history.

(56) References Cited

U.S. PATENT DOCUMENTS

| | | | | |
|---|---|---|---|---|
| 4,617,599 A | * | 10/1986 | Noguchi et al. | 360/32 |
| 4,809,268 A | * | 2/1989 | Tejima et al. | 370/346 |
| 4,813,043 A | * | 3/1989 | Maeno et al. | 714/738 |
| 6,389,525 B1 | * | 5/2002 | Reichert et al. | 711/217 |
| 6,477,672 B1 | * | 11/2002 | Satoh | 714/721 |
| 6,671,845 B1 | * | 12/2003 | Atmeh | 714/738 |
| 7,600,162 B2 | * | 10/2009 | Nishizawa | 714/700 |
| 2003/0099139 A1 | * | 5/2003 | Abrosimov et al. | 365/200 |

FOREIGN PATENT DOCUMENTS

JP 2002124099 A * 4/2002
WO WO 0195339 A2 * 12/2001

OTHER PUBLICATIONS

Resnick, D.; , "Embedded test for a new memory-card architecture," Test Conference, 2004. Proceedings. ITC 2004. International , vol., No., pp. 875-882, Oct. 26-28, 2004 doi: 10.1109/TEST.2004.1387351.*
Privitera, J.; Woo, S.; Soldat, C.; , "Pattern generation tools for the development of memory core test patterns for Rambus devices," Test Conference, 2000. Proceedings. International , vol., No., pp. 444-453, 2000 doi: 10.1109/TEST.2000.894236.*

* cited by examiner

*Primary Examiner*—Cynthia Britt
(74) *Attorney, Agent, or Firm*—Dorsey & Whitney LLP

(57) ABSTRACT

Integrated circuits, load boards and methods are disclosed, such as those associated with a memory testing system that includes an algorithmic pattern generator generating a pattern of command, address or write data digits according to an algorithm. In one such embodiment, the pattern of digits are applied to a frame generator that arranges the pattern of digits into a packet. The packet is then applied to a plurality of parallel-to-serial converters that convert the packet into a plurality of serial digits of a command/address packet or a write data packet, which are output through a plurality of bit lanes. The system might also include a plurality of serial-to-parallel converters receiving respective sets of digits of a read data packet through respective bit lanes. The read data packet is applied to a frame decomposer that extracts a pattern of read data digits from the packet. An error detecting circuit then determines if any of the received read data digits are erroneous.

26 Claims, 5 Drawing Sheets

| | 0 | 1 | 2 | 3 | 4 | 5 | 6 | 7 | 8 |
|---|---|---|---|---|---|---|---|---|---|
| 0 | WD=0 | ACT | P_gp2 | w0/n0 | w1/n1 | w2/n2 | | CRC | CRC |
| 1 | Acc | R_W_gp0 | c2 | c3 | c4 | c5 | DQ_PD | eCA_PD | CRC |
| 2 | s0 | AL | c6 | c7 | c8 | c9 | | aP_gp1 | CRC |
| 3 | s1 | b0 | b1 | b2 | g0 | g1 | | CRC | CRC |
| 4 | r0 | r1 | r2 | r3 | r4 | r5 | r6 | r7 | CRC |
| 5 | r8 | r9 | r10 | r11 | r12 | r13 | r14 | r15 | CRC |

FIGURE 3

WRITE DATA HEADER

| | 0 | 1 | 2 | 3 | 4 | 5 | 6 | 7 | 8 |
|---|---|---|---|---|---|---|---|---|---|
| 0 | WD=1 | d1 | d4 | d7 | d10 | d13 | d16 | CRC | CRC |
| 1 | d0 | d2 | d5 | d8 | d11 | d14 | d17 | d19 | CRC |
| 2 | s0 | d3 | d6 | d9 | d12 | d15 | d18 | d20 | CRC |
| 3 | s1 | d65 | d68 | d71 | d74 | d77 | d80 | CRC | CRC |
| 4 | d63 | d66 | d69 | d72 | d75 | d78 | d81 | d83 | CRC |
| 5 | d64 | d67 | d70 | d73 | d76 | d79 | d82 | d84 | CRC |

WRITE DATA FRAME 1

| | 0 | 1 | 2 | 3 | 4 | 5 | 6 | 7 | 8 |
|---|---|---|---|---|---|---|---|---|---|
| 0 | WD=1 | d22 | d25 | d28 | d31 | d34 | d37 | CRC | CRC |
| 1 | d21 | d23 | d26 | d29 | d32 | d35 | d38 | d40 | CRC |
| 2 | s0 | d24 | d27 | d30 | d33 | d36 | d39 | d41 | CRC |
| 3 | s1 | d87 | d90 | d93 | d96 | d99 | d102 | CRC | CRC |
| 4 | d85 | d88 | d91 | d94 | d97 | d100 | d103 | d105 | CRC |
| 5 | d86 | d89 | d92 | d95 | d98 | d101 | d104 | d106 | CRC |

WRITE DATA FRAME 2

| | 0 | 1 | 2 | 3 | 4 | 5 | 6 | 7 | 8 |
|---|---|---|---|---|---|---|---|---|---|
| 0 | WD=1 | d43 | d46 | d49 | d52 | d55 | d58 | CRC | CRC |
| 1 | d42 | d44 | d47 | d50 | d53 | d56 | d59 | d61 | CRC |
| 2 | s0 | d45 | d48 | d51 | d54 | d57 | d60 | d62 | CRC |
| 3 | s1 | d108 | d111 | d114 | d117 | d120 | d123 | CRC | CRC |
| 4 | | d109 | d112 | d115 | d118 | d121 | d124 | d126 | CRC |
| 5 | d107 | d110 | d113 | d116 | d119 | d122 | d125 | d127 | CRC |

|   | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|----|----|----|----|----|----|----|----|
| 0 | d0 | d4 | d8 | d12 | d16 | d20 | d24 | d28 | d32 | d36 | d40 | d44 | d48 | d52 | d56 | d60 | CRC_a | CRC_a |
| 1 | d1 | d5 | d9 | d13 | d17 | d21 | d25 | d29 | d33 | d37 | d41 | d45 | d49 | d53 | d57 | d61 | CRC_a | CRC_a |
| 2 | d2 | d6 | d10 | d14 | d18 | d22 | d26 | d30 | d34 | d38 | d42 | d46 | d50 | d54 | d58 | d62 | CRC_a | CRC_a |
| 3 | d3 | d7 | d11 | d15 | d19 | d23 | d27 | d31 | d35 | d39 | d43 | d47 | d51 | d55 | d59 | d63 | CRC_a | CRC_a |

|   | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|----|----|----|----|----|----|----|----|
| 0 | d0 | d4 | d8 | d12 | d16 | d20 | d24 | d28 | CRC4 | d32 | d36 | d40 | d44 | d48 | d52 | d56 | d60 | CRC4 |
| 1 | d1 | d5 | d9 | d13 | d17 | d21 | d25 | d29 | CRC4 | d33 | d37 | d41 | d45 | d49 | d53 | d57 | d61 | CRC4 |
| 2 | d2 | d6 | d10 | d14 | d18 | d22 | d26 | d30 | CRC4 | d34 | d38 | d42 | d46 | d50 | d54 | d58 | d62 | CRC4 |
| 3 | d3 | d7 | d11 | d15 | d19 | d23 | d27 | d31 | CRC4 | d35 | d39 | d43 | d47 | d51 | d55 | d59 | d63 | CRC4 |

184

SYSTEM AND METHOD FOR TESTING A PACKETIZED MEMORY DEVICE

TECHNICAL FIELD

This invention relates to memory devices, and, more particularly, in at least one embodiment, a memory device that receives packets comprising commands, addresses and write data.

BACKGROUND OF THE INVENTION

During the fabrication of memory devices, it is conventional to test the integrated circuits of the memory devices at several stages during the fabrication process. For example, the integrated circuits are normally connected to a tester with a probe card when the integrated circuits are still in wafer form. In a final test occurring after the integrated circuits have been diced from the wafer and packaged, the integrated circuits are placed into sockets on a load board. The load board is then placed on a test head, typically by a robotic handler. The test head makes electrical contact with conductors on the load board, and these conductors are connected to the integrated circuits. The test head is connected through a cable to a high-speed tester so that the tester can apply signals to and receive signals from the integrated circuits.

The testers that are typically connected to test heads may assume a variety of forms. They are generally relatively large, complex, and expensive standalone test units, and, in some cases, may be connected to several test heads to simultaneously test the memory devices on several load boards. The testers normally function to write known data to the memory devices mounted on the load boards, and then read data from the memory device and compare the read data to the known data. If all of the comparisons are positive, the memory devices are assumed to be functioning properly. Timing tolerances of the memory devices may be tested by varying the timing relationships between various signals, such as data signals and data strobe signals that are used by the memory devices to capture write data and by the tester to capture read data.

In the past, the data written to the memory devices have often been in a regular pattern of "1s" and "0s" such as a "checker board" pattern that stores all binary values in an array of memory cells adjacent memory cells storing the complementary binary value. Although testers that cause this pattern of data to be stored in memory devices have the advantage of being very capable of detecting memory cell leakage problems, the use of a fixed pattern of data can cause other types of errors to go undetected. The primary reason why errors that may occur during use go undetected is that the regular pattern of data stored in the array of memory cells does not accurately simulate patterns of data that are stored in the memory array during use. To address this issue, conventional memory device testers may generate a pattern of data using an algorithmic pattern generator, which may generate data this is pseudo-random in nature. The storage of pseudo-random data more closely approximates the data that will actually be stored in a memory device during use, and it therefore allows manufacturing defects to be detected that might go undiscovered if a regular pattern of data were stored in the memory device.

Unfortunately, conventional testers that may use an algorithmic pattern generator generate data only in conjunction with conventional memory commands and memory addresses of the type received by dynamic random access memory devices, static random access memory devices, flash memory devices, etc. More recently, memory devices have been proposed and are now being introduced that receive packets through a high-speed communications link that may have one or more serial lanes. Such packets generally include command bits, address bits and write data bits. Further, the memory devices to which the packets are applied may respond with read data in the form of packets containing read data bits. Unfortunately, testers that can generate and insert in the packets an algorithmically generated pattern of data have not been developed. Therefore, the benefits of being able to store data generated by an algorithm pattern generator is not available to testers for testing packetized memory devices.

There is therefore a need for a packetized memory device tester and method that can store algorithmically generated patterns of data in packetized memory devices, and then read data packets from the memory devices to determine if the pattern of read data matches the pattern of write data.

BRIEF DESCRIPTION OF THE DRAWINGS

FIG. 3 is a schematic diagram of one embodiment of a command packet that can be generated by the integrated test circuit of FIG. 2.

FIG. 4 is a schematic diagram of one embodiment of write data packets that can be generated by the integrated test circuit of FIG. 2.

FIG. 5 is a schematic diagram of one embodiment of a read data packet that can be received and processed by the integrated test circuit of FIG. 2.

FIG. 6 is a schematic diagram of another embodiment of a read data packet that can be received and processed by the integrated test circuit of FIG. 2.

DETAILED DESCRIPTION

Figure 1:
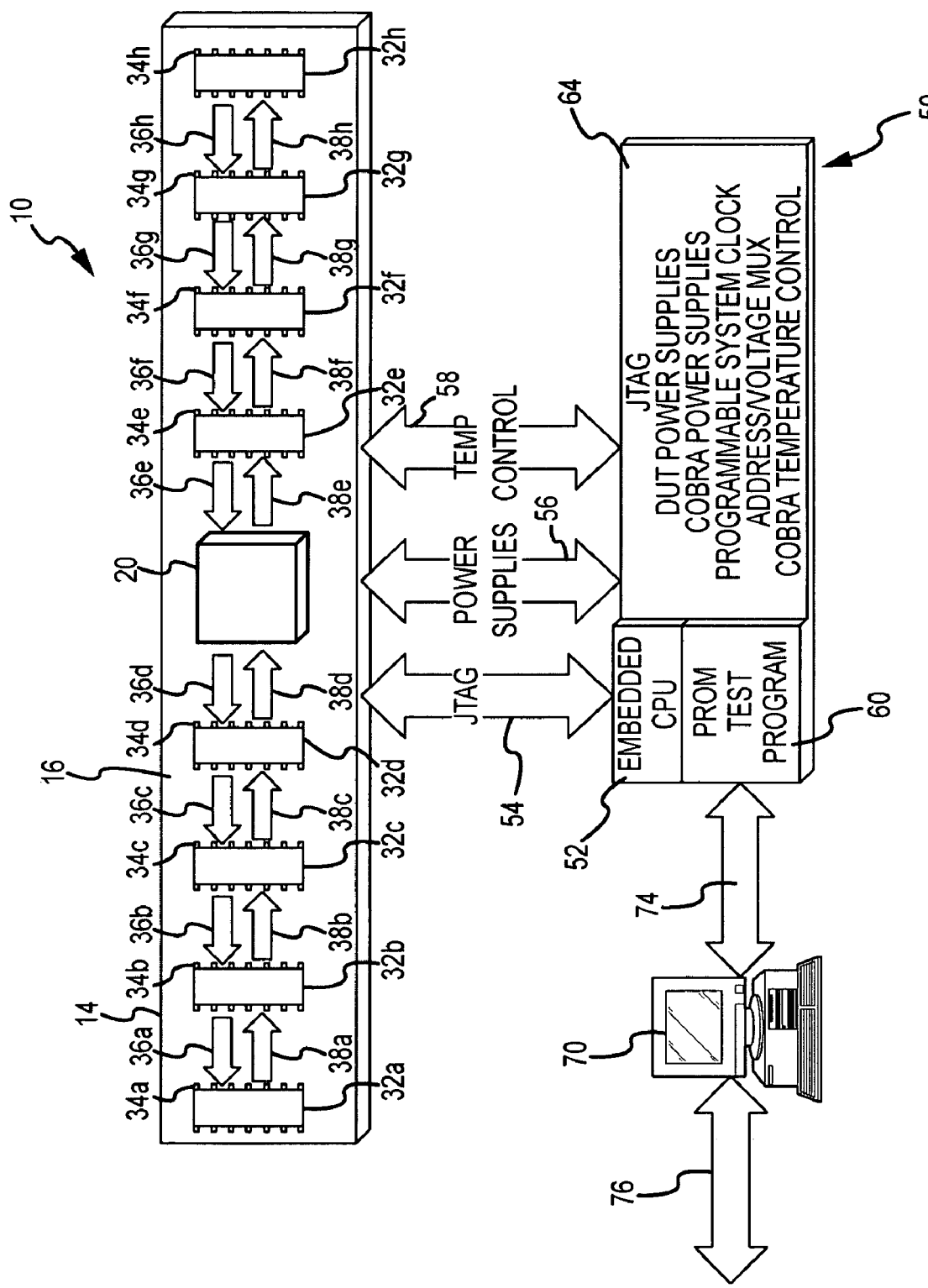
FIG. 1 is a block diagram of a test system according to one embodiment of the invention.

A test system 10 according to one embodiment of the invention is shown in FIG. 1. The test system 10 includes a load board 14 having an insulative substrate 16 on which is mounted a integrated test circuit 20 connected to eight memory devices 32$a$-$h$ through respective sets of terminals 34$a$-$h$. Each of the terminals 34$a$-$h$ may be formed by respective integrated circuit sockets. The memory devices 32$a$-$h$, which may be dynamic random access memory ("DRAM") devices, are directly connected to the integrated test circuit 20 through respective high-speed downstream links 36$a$-$h$ and respective high-speed upstream links 38$a$-$h$. The integrated test circuit 20 transmits packets containing a memory command digit, address digits and, in some cases, write data digits through the downstream links 36$a$-$h$ to the respective memory devices 32$a$-$h$. The memory devices 32$a$-$h$ may respond to the memory commands in the packet by writing a packet containing write data digits, e.g. bits, if the command is for a write operation or by transmitting a packet containing read data bits to the test circuit through the respective upstream links 38$a$-$h$.

The integrated test circuit 20 is coupled to interface circuitry 50, including an embedded CPU 52. The interface circuitry 50 is coupled to the test circuit 20 through a conventional JTAG bus 54. The interface circuitry 50 supplies power to the load board 14 through power supply lines 56. Finally, the interface circuitry 50 may also be coupled to the test circuit 20 through temperature control lines 58 that provide signals indicative of the temperature of the load board 14. The interface circuitry 50 includes a test program, which may be stored in a programmable read only memory ("PROM") 60 included in the interface circuitry 50. This test program performs tests on a programmable system clock, address/voltage multiplexers, and temperature control circuits 64 which are included in the interface circuitry along with the CPU 52

In operation, the interface circuitry 50 receives a test file from a host 70, which may be a conventional personal computer. The host 70 is coupled to the interface circuitry 50 through suitable means, such as a Local Ethernet network 74. The host 70 may also be coupled to a larger network, such as a production management system, through a Corporate Ethernet network 76. The interface circuitry 50 then passes the test file onto the integrated test circuit 20, which then transmits a packet containing command and address digits, e.g., and a pattern of write data digits (e.g. bits) to the memory devices 32a-h. After the pattern of data bits has been written to the memory devices 32a-h, the integrated test circuit 20 generates a packet containing command and address bits to read the contents of the memory devices. In response, the memory devices 32a-h output a packet of read data digits (e.g. bits), which are received by the integrated test circuit 20. The integrated test circuit 20 then compares the read data bits to the pattern of write data bits to provide test results, and it formulates the test results into high-level test data. The integrated test circuit 20 outputs test data to the CPU 52, which passes the test data to the host 70 through the Local Ethernet network 74.

Figure 2:
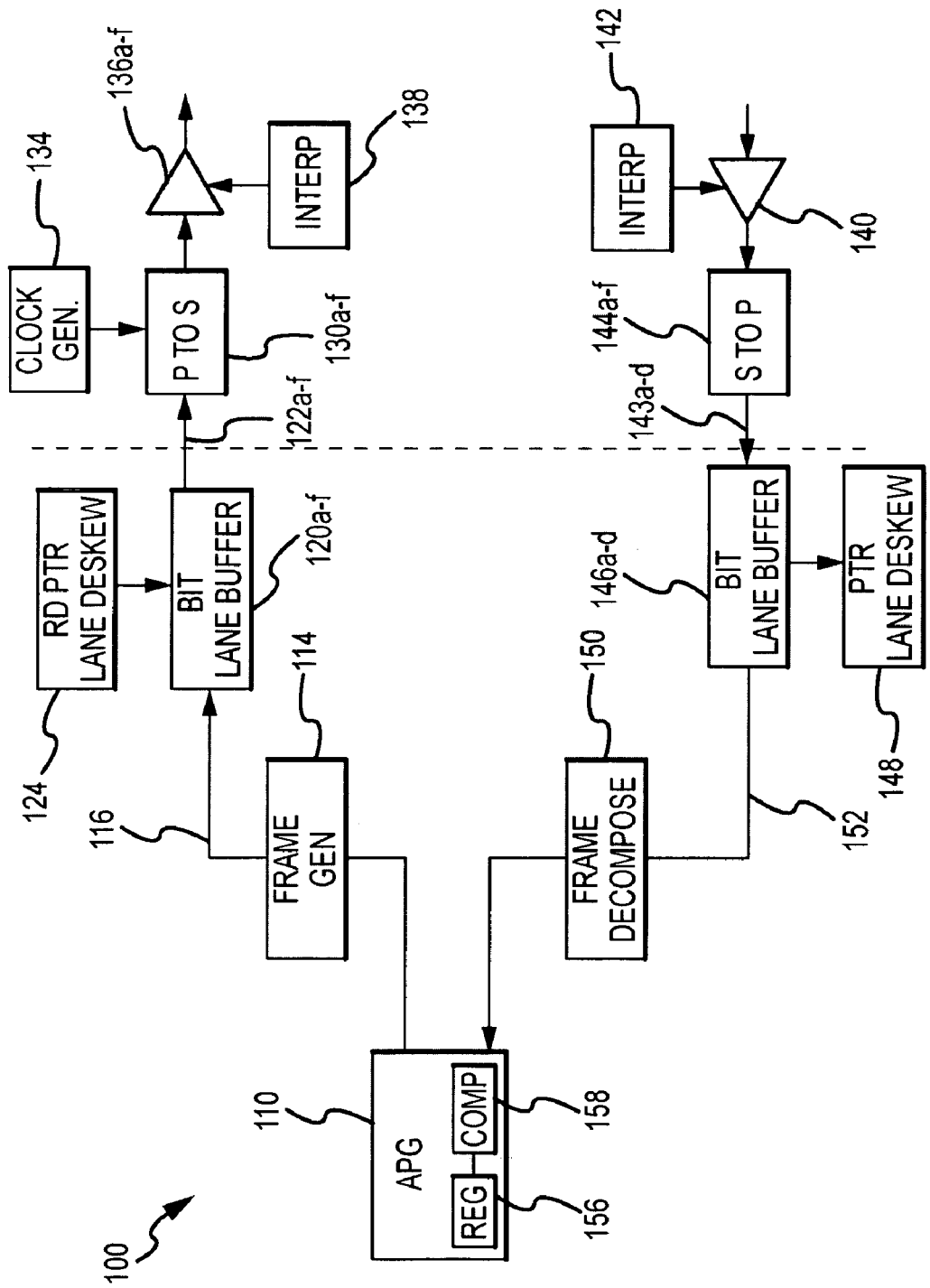
FIG. 2 is a block diagram of an integrated test circuit according to an embodiment of the invention that can be used in the test system of FIG. 1.

An integrated test circuit 100 according to an embodiment of the invention is shown in FIG. 2. The integrated test circuit 100 may be used as the integrated test circuit 20 in the system 10 shown in FIG. 1. The integrated test circuit 100 includes an algorithmic pattern generator ("APG") 110 that generates command, address and write data bits according to a specific algorithm. The format of the command signals may be those used for a typical dynamic random access memory such as row address strobe ("RAS"), column address strobe ("CAS"), write/read* (W/R*), write data strobe ("DQS") and chip select ("CS") signals. The algorithm may cause write data to be stored in an array of memory cells in a predetermined pattern. For example, the algorithm may be selected to write a pseudo-random set of data bits to the array of memory cells in the memory devices 32a-h (FIG. 1). The pattern may have a regular pattern of reoccurring bits, such as a checkerboard pattern in which a memory cell storing one binary value is surrounded by memory cells storing the opposite binary value. Another pattern that may be used includes, without limitation, a "marching X & Y" pattern. The command, address and write data bits are applied to a frame generator 114, which formats the bits from the APG 110 into packets containing either command and address bits or write data bits. The frame generator 114 may be implemented in a variety of means such as by using a microprocessor or microcontroller (not shown) executing a suitable microcode and interfacing with read only memory ("ROM") program memory and random access system memory. The packets generated by the frame generator 114 are the type normally received by the memory devices 32a-h. The characteristics of various types of packets are discussed in detail below. The command, address and write data bits in the packet are output from the frame generator 114 through a parallel bus 116 having a width corresponding to the number of bits in the packet. For example, if the frame generator 114 outputs a packet containing 54 bits, the bus 116 will be 56 bits wide.

With further reference to FIG. 2, the bits of the packets output from the frame generator 114 are applied to a set of six bit lane buffers 120a-f. The timing of the buffers 120a-f relative to each other may be controlled by a lane deskew circuit 124. Each of the bit-lane buffers 120a-f receives and stores respective sets of 9 bits and outputs them through a respective 9-bit bus 122a-f. The specific bits output by each of the bit lane buffers 120a-f will be explained with reference to FIG. 3.

The 9 bits from each of the six bit lane buffers 120a-f are applied to a respective one of six parallel-to-serial ("P/S") converters 130a-f, which are clocked at a high-speed responsive to a clock signal from a clock generator 134. Each of the P/S converters 130a-f may be implemented using a variety of means including a set of high speed multiplexers that sequentially couple each of the 9 bits from the respective bit lane buffers 120a-f to the respective bit lanes. The six P/S converters 130a-f output the bits in respective serial bit lanes, with corresponding bits in each bit lane being output from the respective buffers 130a-f at the same time. The format of these bit lanes constituting each packet will be described in greater detail below. Each bit lane is output from a respective one of six transmitters 136a-f. The timing of each bit lane may be adjusted relative to each other by a phase interpolator 138 to ensure that corresponding bits of each lane are transmitted from the test circuit 100 at the same time. The packets transmitted by the transmitters 136a-f are then received and processed by the memory devices 32a-h (FIG. 1).

If the packet transmitted to the memory devices is a command for a memory read operation, the memory devices send a read data packet to the integrated test circuit 100. The bit lanes of the packet are applied to a receiver 140, and the relative timing of the bits in each lane may be adjusted by a phase interpolator 142 in the event any of the bit lanes are skewed in time relative to other bit lanes. If, for example, the read data packet contains 4 bit lanes, each of the 4 bit lanes are applied to a respective one of 4 serial-to-parallel ("S/P") converters 144a-d, each of which convert the serial stream of, for example, 9 bits in each bit lane to parallel data. The 9 parallel bits of data from each S/P converter 144a-d are coupled through a respective 9 bit bus 143a-d to a respective one of 4 bit lane buffers 146a-d. The timing of the data in one bit lane may be adjusted relative to the timing in other bit lanes by a lane deskew circuit 148. The bit lane buffers 146a-d output the bits in the received read data packet to a frame decomposer 150 through a 36-bit bus 152, assuming the read data packet contains 4 bit lanes each containing 9 bits.

The frame decomposer 150 extracts the read data bits from the parallel data received from the bit lane buffers 146a-d and applies them to an error detection circuit, such as the APG 110. For example, the APG includes an internal register 156 that maintains a record of the bits in each write data packet. The APG 110 may also include an internal comparator 158 that compares the bits in each write data packet to the data bits in the received read data packet to determine if the read data matches the corresponding write data. Alternatively, as described below, the read data packet may contain error detecting codes that were contained in the write data packets and thus stored in the memory devices 32a-h. The APG 110 may then include appropriate circuitry for determining if the error detecting codes correspond to the read data in the packets.

One example of a typical command packet 160 is shown in FIG. 3 in which each packet is formed by 6 9-bit sets and thus contains 54 bits. Each of the 6 9-bit sets is applied to a respective one of the 6 bit lane buffers 120a-f which outputs the 9 bits to a respective one of the P/S converters 130a-f. The P/S converters 130a-f simultaneously output corresponding bits. More specifically, the converters 130a-f output the 0 bits, then the 1 bits, etc. until the 8 bits are output.

As shown in FIG. 3, the 0 bit of the first word of the packet 160 is WD=0, which indicates that the packet contains command and address bits. In this type of packet, each word is transmitted serially over one of 6 bit lanes in one of the downstream communications links 36a-h so that each set of 9 bits is transmitted through a respective bit lane. The last and second-to-last bits of bit lanes 0 and 3, as well as the last bits of bit lanes 1, 2, 3, and 4 contain cyclic redundancy check ("CRC") bits that allow the memory devices to confirm that the received command and address bits are the same as those transmitted, i.e., there were no errors generated in transmitting the address and commands between the APG 110 and the memory devices.

If the command/address packet 160 (e.g., a packet containing command and/or address digits) shown in FIG. 3 is for a write access, the packet 160 is followed by one or more packets of write data. An example of write data packets 170 is shown in FIG. 4. As shown in FIG. 4, the write data is sent in the form of 3 successive packets 170a-c containing a total of 128 bits. The first bit WD of the bit 0 lane is a 1, which indicates the packet 170 is a write data packet. In addition to the WD bit, the bit lanes 0-2 of the first packet 170a contain write data bits d0-d20, an s0 bit indicating *, and three CRC bits, which are used to check the accuracy of the bits d0-d20. The bit lanes 3-5 of the first packet 170a contain write data bits d65-d84, an s1 bit indicating *, and three additional CRC bits, which are used to check the accuracy of the bits d65-d84. In a similar manner the second write data packet 170b contains an initial WD bit of 1, s0 and s1 bits, two groups of write data bits d21-d41 and d87-d106, respectively, and 3 CRC bits for each group. Finally, the third write data packet 170c also contains an initial WD bit of 1 and s0 and s1 bits, as well as two groups of write data bits d42-d62 and d108-d127, respectively, and 3 CRC bits for each group. Thus, the first three bit lines of all three packets 170a-c contain write data bits d0-d62, and the second three bit lines of all three packets contain write data bits d63-d127.

If the command/address packet 160 shown in FIG. 3 is for a read access, the memory device sends to the test circuit 100 one or more read data packets. As shown in FIG. 5, read data is transmitted by the memory device in the form of a data packet 180 that uses only four bit lanes but each bit lane contains 18 bits. The first 9 bits of the packet 180 contains read data bits d0-d35, and the second 9 bits of the packet 180 contain bits d36-d63 as well as 8 CRC bits. The use of 8 CRC bits to check 64 bits of data provides strong error correcting coverage, but requires more circuit complexity and time to calculate the CRC bits.

An alternative embodiment of a read data packet 184 is shown in FIG. 6. The packet 184 also contains 4 bit lanes and 18 bits, but the first and last groups of 9 bits each contain 4 respective CRC bits. Thus, the accuracy of the data bits d0-d31 in the first 8 bits are checked by the CRC bit 9 in each of the 4 bit lanes, and the accuracy of the data bits d32-d63 in bits 10-16 are checked by the CRC bit 17 in each of the 4 bit lanes. The read data packet 184 has the advantage over the read data packet 180 in that the CRC in the packet 184 can be calculated with less circuit complexity and time since only 4 CRC bits are calculated, and they are calculated from only 32 bits of data. In contrast, the read data packet 180 calculates 8 CRC bits, and they are calculated from only 64 bits of data. However, the read data packet 180 has the advantage of providing stronger CRC protection for the 64 bits of read data.

Figure 7:
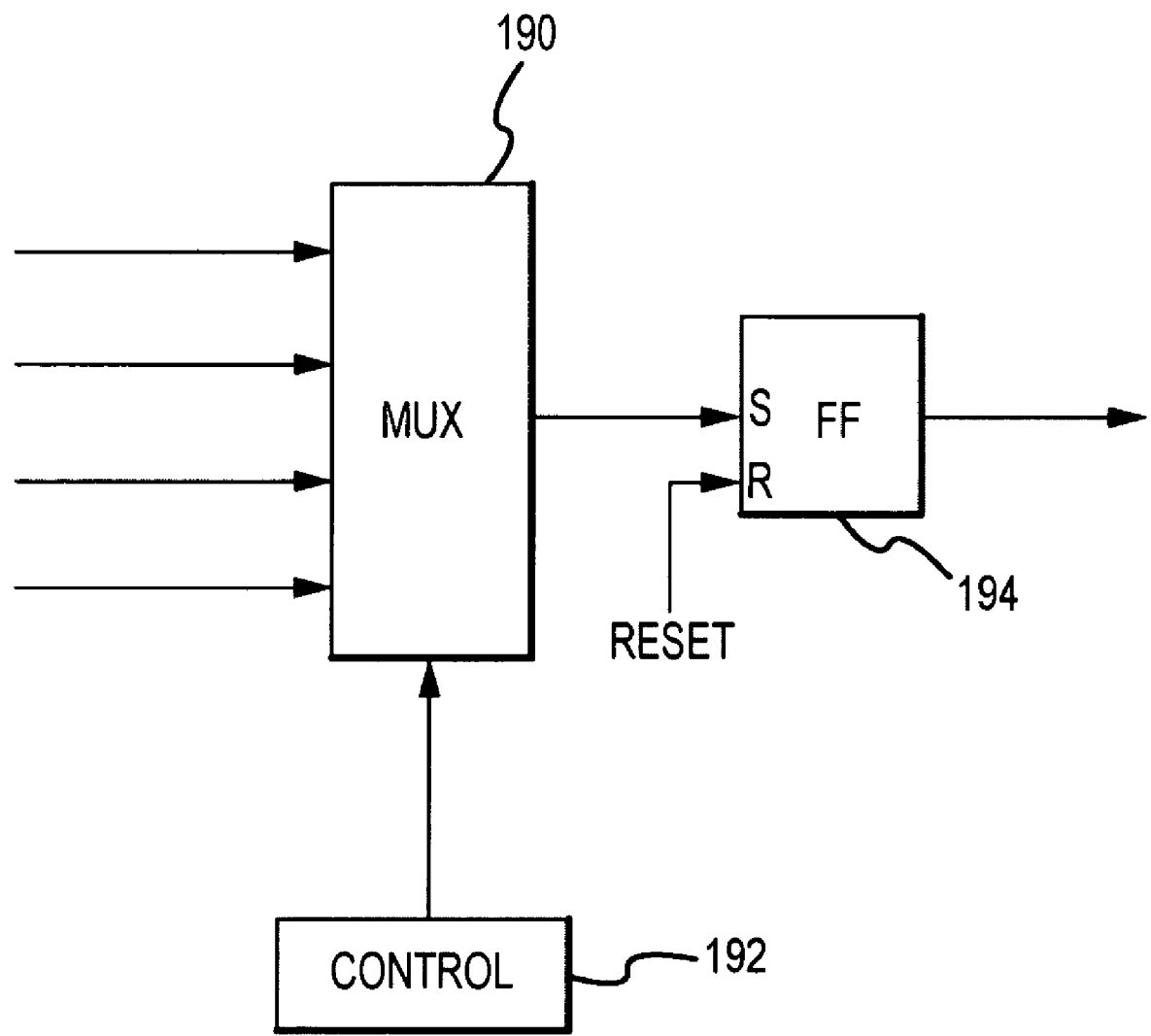
FIG. 7 is a block diagram showing a portion of one embodiment of a frame generator that can be used in the integrated test circuit of FIG. 2.

The frame generator 114 may be implemented in a variety of ways, such as by coupling the incoming bits through multiplexers and flip-flops. One embodiment of a portion of the frame generator 114 for generating the bit X is shown as shown in FIG. 7. The signal lines on which signals from the APG 110 that can be used for the bit X are applied to respective inputs of a multiplexer 190. For example, if the multiplexer 190 is used to generate bit 3 in bit lane 2 of the packets 170a-c (FIG. 4), the inputs of the multiplexer 190 would be coupled to receive d9, d30 and d51. If the packet 170b was being generated, a control circuit 192 would cause the multiplexer 190 to couple the d30 signal to the output of the multiplexer 190. The output of the multiplexer 190 is applied to the S input of a set-reset flip-flop 194, which is reset prior to generating each frame. The flip-flop 194 thus outputs the binary value for bit 3 in bit lane 2 of the packet currently being generated.

The frame decomposer 150 can be implemented in a similar manner except that each multiplexer (not shown) would have a single output and multiple inputs.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated test circuit, comprising:
   an algorithmic pattern generator configured to generate a pattern of digits according to an algorithm;
   a frame generator coupled to the algorithmic pattern generator and configured to receive the pattern of digits from the algorithmic pattern generator, the frame generator configured to convert the pattern of digits from the algorithmic pattern generator into a packet comprising both command and address data; and
   a plurality of parallel-to-serial converters coupled to the frame generator, the plurality of parallel-to-serial converters configured to receive the packet of command and address data, convert the packet into a plurality of sets of command and address bits, and transmit each of the sets of command and address bits through a respective bit lane;
   wherein each of the respective bit lanes is configured to transmit data unilaterally.

2. The integrated test circuit of claim 1, further comprising a de-skewing circuit operable to control the timing of corresponding bits output from each of the parallel-to-serial converters relative to the bits output from the other of the parallel-to-serial converters.

3. The integrated test circuit of claim 1 wherein the algorithmic pattern generator is further operable to generate an error detecting code corresponding to the generated pattern of digits, and to transmit to the frame generator error detecting digits corresponding to the generated error detecting code, and wherein the frame generator is operable to insert the error detecting digits into the packet.

4. The integrated test circuit of claim 1 wherein the algorithmic pattern generator is operable to generate a first pattern of digits and a second pattern of digits, the first pattern of digits containing command and address data, and the second pattern of digits containing write data.

5. The integrated test circuit of claim 1, further comprising a phase interpolator operable to adjust the timing of corresponding bits transmitted from each of the parallel-to-serial converters relative to the bits transmitted from the other of the parallel-to-serial converters.

6. The integrated test circuit of claim 1 wherein the plurality of parallel-to-serial converters comprises a plurality of multiplexers each of which have a plurality of input terminals coupled to receive respective digits of the packet from the frame generator and an output terminal coupled to a respective bit lane.

7. An integrated test circuit, comprising:
   a plurality of serial-to-parallel converters coupled to receive respective sets of read digits through respective unilateral bit lanes, at least one of the plurality of serial-to-parallel converters being operable to convert the read digits into a packet containing a plurality of read digits;
   a frame decomposer coupled to receive the packet, the frame decomposer being operable to extract a pattern of read digits from the packet; and
   an error detecting circuit coupled to receive the pattern of read digits and being operable to determine if there is an error based at least partially on a CRC bit calculation.

8. The integrated test circuit of claim 7 wherein the error detecting circuit comprises:
   a register operable to maintain a record of digits; and
   a comparator operable to compare the read digits received from the frame decomposer to the digits stored in the register.

9. The integrated test circuit of claim 7, further comprising a de-skewing circuit operable to adjust the timing of corresponding read digits output from each of the serial-to-parallel converters relative to the read digits output from the other of the serial-to-parallel converters.

10. The integrated test circuit of claim 7 wherein multiple CRC bits are not transferred in the same unilateral bit lane consecutively.

11. The integrated test circuit of claim 7, further comprising a phase interpolator operable to adjust the timing of corresponding read digits received by each of the serial-to-parallel converters relative to the read digits received by other of the serial-to-parallel converters.

12. The integrated test circuit of claim 7 wherein the plurality of serial-to-parallel converters comprise at least one of a plurality of multiplexers having an input terminal coupled to a respective unilateral bit lane and at least one of a plurality of output terminals operable to output respective read digits of the packet.

13. A load board for testing a plurality of memory devices, the load board comprising:
   a substrate;
   a plurality of sets of integrated circuit terminals mounted on the substrate for coupling to respective integrated circuit memory devices; and
   an integrated test circuit mounted on the substrate, the integrated test circuit comprising:
   an algorithmic pattern generator configured to generate a pattern of digits according to an algorithm, the digits comprising either command digits and address digits or write data digits;
   a frame generator coupled to the algorithmic pattern generator and configured to receive the pattern of digits from the algorithmic pattern generator, the frame generator configured to convert the pattern of digits from the algorithmic pattern generator into a packet containing a plurality of digits;
   a plurality of parallel-to-serial converters coupled to the sets of integrated circuit terminals, the parallel-to-serial converters configured to receive respective sets of digits of the packet from the frame generator and convert the packet into a plurality of serial digits and transmit each of the plurality of serial digits to the integrated circuit terminals through respective unilateral input bit lanes;
   a plurality of serial-to-parallel converters coupled to the sets of integrated circuit terminals, the serial-to-parallel converters configured to receive respective sets of digits of a read data packet through respective bit lanes, the serial-to-parallel converters configured to convert the respective sets of digits of a read data packet into a read data packet containing a plurality of read data digits;
   a frame decomposer coupled to receive the read data packet from the serial-to-parallel converters, the frame decomposer configured to extract a pattern of read data digits from the packet received from the serial-to-parallel converters; and
   an error detecting circuit coupled to receive the read data digits from the frame decomposer and configured to determine if any of the read data digits are erroneous digits.

14. The load board of claim 13 wherein the error detecting circuit comprises:
   a register operable to maintain a record of the patterns of write data digits generated by the algorithmic pattern generator; and
   a comparator operable to compare the read data digits received from the frame decomposer to the write data digits stored in the register.

15. The load board of claim 13, further comprising a de-skewing circuit operable to control the timing of corresponding digits output from each of the serial-to-parallel converters relative to the digits output from the other of the serial-to-parallel converters.

16. The load board of claim 13, further comprising a phase interpolator operable to control the timing of corresponding digits received by each of the serial-to-parallel converters relative to the digits received by other of the serial-to-parallel converters.

17. The load board of claim 13, further comprising a de-skewing circuit operable to control the timing of corresponding digits output from each of the parallel-to-serial converters relative to the digits output from the other of the parallel-to-serial converters.

18. The load board of claim 13 wherein the algorithmic pattern generator is further operable to generate an error detecting code corresponding to the generated pattern of write data digits, and to transmit to the frame generator error detecting digits corresponding to the generated error detecting code, and wherein the frame generator is operable to insert the error detecting digits into the packet.

19. The load board of claim 13, further comprising a phase interpolator operable to control the timing of corresponding digits transmitted from each of the parallel-to-serial converters relative to the digits transmitted from the other of the parallel-to-serial converters.

20. The load board of claim 13 wherein the plurality of parallel-to-serial converters comprises a plurality of multiplexers each of which have a plurality of input terminals coupled to receive respective write data digits of the write data packet from the frame generator and an output terminal coupled to a respective bit lane.

21. The load board of claim 13 wherein the error detecting circuit uses CRC bit calculations to determine if any of the read data digits are erroneous digits.

22. A method of testing a memory device, comprising:
converting at least one of a plurality of memory commands and at least one of a plurality of memory addresses to a command/address packet;
converting write data to a write data packet;
converting the command/address packet to a plurality of serial streams of command digits and address digits;
converting the write data packet to a plurality of serial streams of write data digits;
transmitting the plurality of serial streams of command digits and address digits through a corresponding plurality of memory input lanes;
transmitting the plurality of serial streams of write data digits through the corresponding plurality of memory input lanes;
receiving at least one of a plurality of serial streams of read data digits from a plurality of memory output lanes;
converting the read data digits into a read data packet; and
extracting read data from the read data packet.

23. The method of claim 22, further comprising:
determining if there are any errors based at least partially on the read data.

24. The method of claim 23 wherein the act of determining if there are any errors comprises:
providing an error detecting code in the write data packet, the error detecting code corresponding to the write data in the write data packet;
receiving an error detecting code in the read data packet, the error detecting code corresponding to the read data in the read data packet; and
determining from the error detecting code in the read data packet if there are any errors.

25. The method of claim 22 wherein the act of transmitting the plurality of serial streams of write data digits through the memory input lanes further comprises:
adjusting the timing of at least one of the serial streams of write data digits relative to the timing of at least another of the serial streams of write data digits.

26. The method of claim 23 wherein the act of determining if there are any errors comprises:
comparing the read data to the write data.

* * * * *